(12) United States Patent
Lim et al.

(10) Patent No.: US 7,675,339 B2
(45) Date of Patent: Mar. 9, 2010

(54) SYSTEM AND METHOD FOR GENERATING A DELAYED CLOCK SIGNAL OF AN INPUT CLOCK SIGNAL

(75) Inventors: Peter Ngee Ching Lim, Singapore (SG); Cheng Huat Tan, Singapore (SG); Kin Soon Liew, Singapore (SG)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 377 days.

(21) Appl. No.: 11/673,394

(22) Filed: Feb. 9, 2007

(65) Prior Publication Data

US 2008/0191764 A1 Aug. 14, 2008

(51) Int. Cl.
*H03H 11/26* (2006.01)

(52) U.S. Cl. ...................................... 327/262; 327/264

(58) Field of Classification Search ......... 327/261–264, 327/231, 254, 255
See application file for complete search history.

(56) References Cited

U.S. PATENT DOCUMENTS

| | | | | | |
|---|---|---|---|---|---|
| 5,572,158 | A | * | 11/1996 | Lee et al. | 327/175 |
| 5,914,623 | A | * | 6/1999 | Fujita | 327/254 |
| 6,084,452 | A | * | 7/2000 | Drost et al. | 327/175 |
| 7,057,431 | B2 | | 6/2006 | Kwak | |
| 7,227,809 | B2 | * | 6/2007 | Kwak | 365/189.15 |
| 7,423,465 | B2 | * | 9/2008 | Gomm | 327/175 |

* cited by examiner

*Primary Examiner*—Hai L Nguyen

(57) ABSTRACT

A system and method for generating a delayed clock signal of an input clock signal involves selectively delaying the input clock signal to produce the delayed clock signal based on the duty cycle of the input clock signal and the duty cycle of a logic signal derived from a logic operation of the input clock signal and the delayed clock signal.

20 Claims, 3 Drawing Sheets

US 7,675,339 B2

1

SYSTEM AND METHOD FOR GENERATING A DELAYED CLOCK SIGNAL OF AN INPUT CLOCK SIGNAL

BACKGROUND OF THE INVENTION

Double Data Rate (DDR), Quad Data Rate (QDR) or even more complex data clocking schemes are becoming common in order to meet the high data bandwidth requirement of recent systems. The data source, e.g., a chip on a PCB, usually supplies source synchronous data/clock, where the data transition edges line up with the clock transition edges with certain amount of jitter specification. The data destination, e.g., another chip on the same PCB, cannot simply use the supplied clock to clock the supplied data because of the source synchronicity. For DDR scheme, the data destination usually needs to derive a quadrature clock that is shifted by ninety degrees from the supplied clock in order to clock the supplied data.

A typical approach used in the industry to derive a quadrature clock is to use a complex circuitry, such as a Delay Locked Loop (DLL). However, this approach entails the following implementation issues:

1. DLL is usually a high speed, precision analog circuit that needs to have its own quite and properly isolated power and ground supplies, which requires a plethora of intricate design and noise isolation considerations. Although a digital-counter-based type of DLL that is simpler to design does exist, such DLL can only operate at much lower speed.

2. DLL design requires the use of a voltage/current controlled delay element, which has frequency tuning range limitation. It is very challenging to get a voltage/current controlled delay element design to work across a wide range of frequency, especially across entire IC Process, Voltage and Temperature (PVT) range. Thus, DLL design tends to have a somewhat narrow frequency operating range.

3. DLL design is not portable across different IC processes. Significant redesign effort is required every time the IC process is changed, which consumes precious engineering resources.

4. Designing a DLL to work over the entire PVT range is technically challenging, especially in low cost digital CMOS IC processes where precision devices are not readily available.

5. Designing a DLL into a large digital chip requires very significant effort. As an example, integration of the DLL into the data clocking area of a large digital chip is a complex task requiring a lot of attention to ensure signal integrity. In addition, it requires a complex, mixed-digital analog design verification.

The above implementation issues translate into long design and verification cycle time, which may result in severe detrimental schedule and financial consequences.

In view of the above issues, what is needed is a system and method for generating a delayed clock signal of an input clock signal that addresses at least some of these issues.

SUMMARY OF THE INVENTION

A system and method for generating a delayed clock signal of an input clock signal involves selectively delaying the input clock signal to produce the delayed clock signal based on the duty cycle of the input clock signal and the duty cycle of a logic signal derived from a logic operation of the input clock signal and the delayed clock signal. The system and method eliminates the need to use any voltage/current controlled delay element, which resolves many disadvantages associated with using such a delay element.

A system in accordance with an embodiment of the invention comprises a duty cycle measuring unit and a delayed signal generating unit. The duty cycle measuring unit is connected to receive an input clock signal. The duty cycle measuring unit is configured to compare the duty cycle of the input clock signal with a reference duty cycle to produce a duty cycle signal. The delayed signal generating unit is connected to the duty cycle measuring unit to receive the duty cycle signal. The delayed signal generating unit is configured to generate a delay polarity signal using the duty cycle signal, the duty cycle of the input clock signal and the duty cycle of a logic signal derived from a logic operation of the input clock signal and the delayed clock signal. The delayed signal generating unit is further configured to adjust the delay of the delayed clock signal using the delay polarity signal.

A system in accordance with another embodiment of the invention comprises a duty cycle measuring unit and a delayed signal generating unit. The duty cycle measuring unit is connected to receive an input clock signal. The duty cycle measuring unit is configured to compare the duty cycle of the input clock signal with a reference duty cycle to produce a duty cycle signal. The delayed signal generating unit is connected to the duty cycle measuring unit to receive the duty cycle signal. The delayed signal generating unit is configured to selectively delay the input clock signal to produce a delayed clock signal based on one of a first comparison and a second comparison in response to the duty cycle signal. The first comparison is a comparison of the duty cycle of the input clock signal and the duty cycle of an AND'ed signal, which is an output signal from an AND logic operation of the input clock signal and the delayed clock signal. The second comparison is a comparison of the duty cycle of an inverse signal of the input clock signal and the duty cycle of a NOR'ed signal, which is an output signal from a NOR logic operation of the input clock signal and the delayed clock signal.

A method in accordance with an embodiment of the invention comprises comparing the duty cycle of an input clock signal with a reference duty cycle to produce a duty cycle signal, generating a delay polarity signal using the duty cycle signal, the duty cycle of the input clock signal and the duty cycle of a logic signal derived from a logic operation of the input clock signal and the delayed clock signal, and adjusting the delay of the delayed clock signal using the delay polarity signal.

Other aspects and advantages of the present invention will become apparent from the following detailed description, taken in conjunction with the accompanying drawings, illustrated by way of example of the principles of the invention.

DETAILED DESCRIPTION

Figure 1:
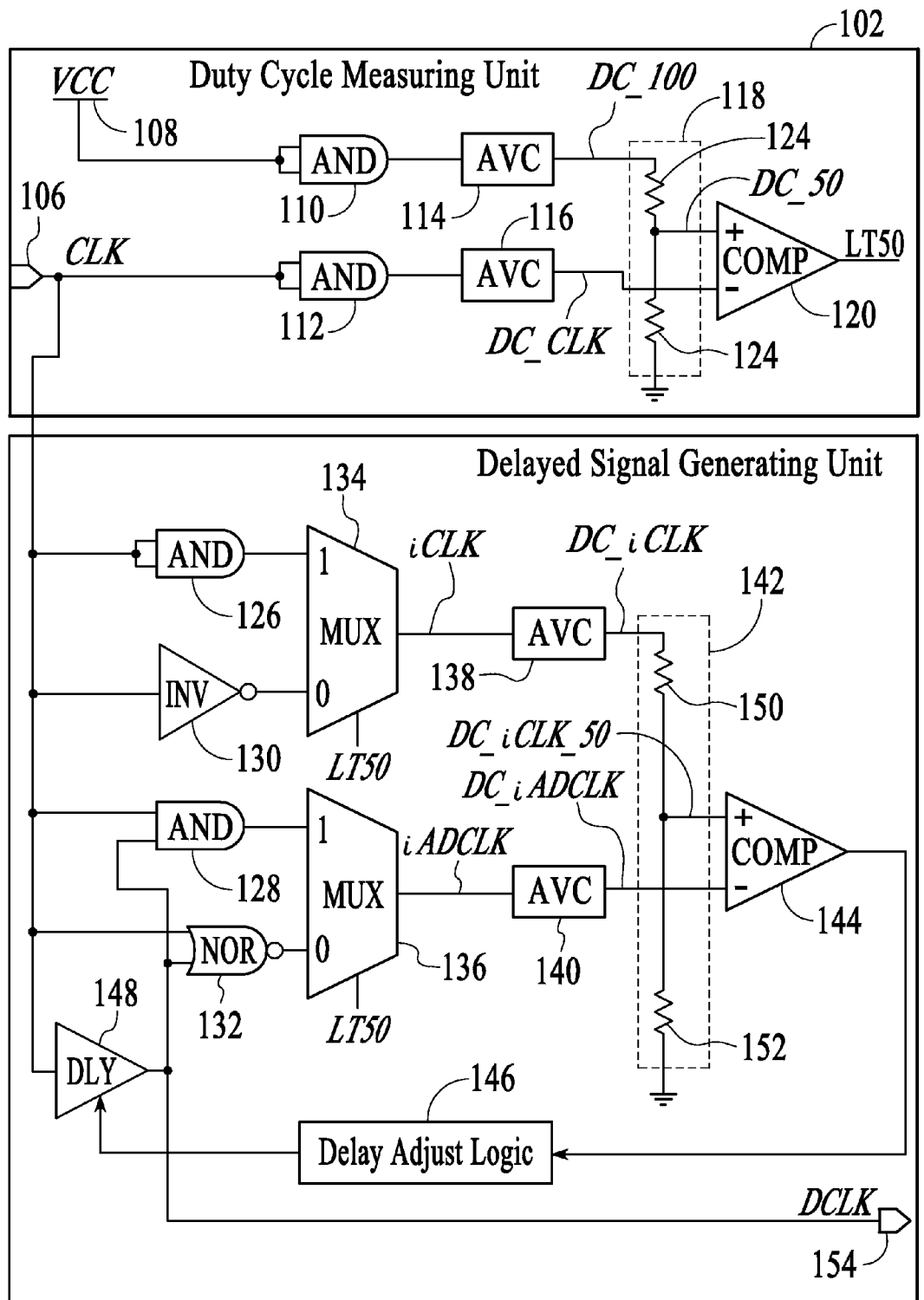
FIG. 1 is a block diagram of a system for generating a delayed clock signal of an input clock signal in accordance an embodiment of the invention.

With reference to FIG. 1, a system for generating a delayed clock signal of an input clock signal in accordance with an embodiment of the invention is described. The system operates to generate the delayed clock signal, DCLK, from the input clock signal, CLK, using a duty cycle feedback mechanism to delay the input clock signal to produce the delayed clock signal. For Double Data Rate (DDR) scheme, the delayed clock signal is a quadrature clock signal (i.e., shifted by 90 degrees) of the input clock signal. However, for other schemes, the delayed clock signal may be delayed by other amounts. As described in more detail below, the duty cycle feedback mechanism of the system involves performing an AND or NOR logic operation on the input and delayed clock signals followed by comparing the duty cycle of the AND'ed or NOR'ed signal with the duty cycle of the input clock signal or an inverse signal of the input clock signal to control the amount of delay of the input clock signal to produce the delayed clock signal. As a result, the system can be implemented using mostly digital logic elements with few analog elements that run at very low speed and require moderate precision. Furthermore, the system does not need to use any voltage/current controlled delay element, which resolves many disadvantages associated with using such a delay element. In particular, the design of the system allows the operation of the system to be substantially IC Process, Voltage and Temperature (PVT) independent.

Figure 2:
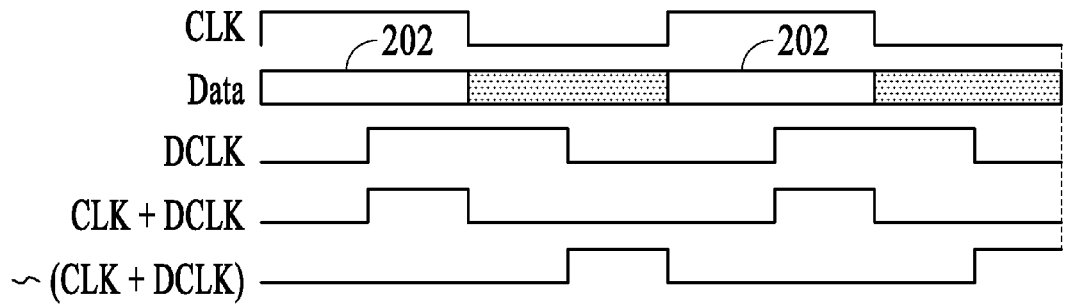
FIG. 2 is a waveform diagram showing that the amount of delay between the input clock signal, CLK, and the delayed clock signal, DCLK, can be determined by the duty cycles of CLK, DCLK, an AND'ed signal of CLK and DCLK, and a NOR'ed signal of CLK and DCLK.
Figure 3:
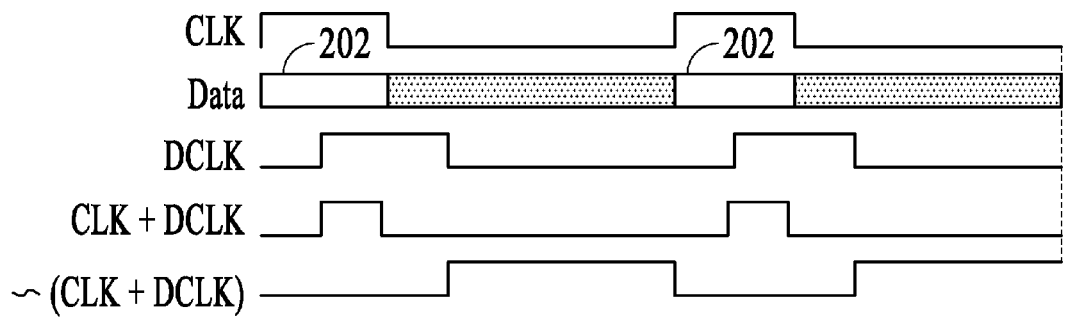
FIG. 3 is a waveform diagram showing the relationship between the duty cycle of AND'ed signal divided by the duty cycle of CLK when the duty cycle of CLK is less than or equal to 50%.
Figure 4:
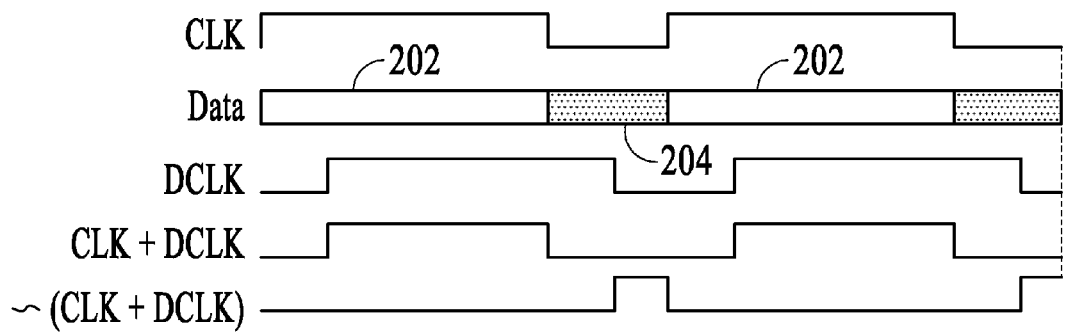
FIG. 4 is a waveform diagram showing the relationship between the duty cycle of NOR'ed signal divided by the duty cycle of an inverse signal of CLK when the duty cycle of CLK is greater than or equal to 50%.

The system is based on the following observations, which are described with reference to FIGS. 2-4. In FIGS. 2-4, waveforms of an input clock signal, CLK, and a delayed clock signal, DCLK, are shown. Also shown in FIGS. 2-4 are waveforms of AND'ed signal of CLK and DCLK, CLK*DCLK, and a NOR'ed signal of CLK and DCLK, ~(CLK+DCLK), as well as data valid windows 202. The AND'ed signal, CLK*DCLK, is an output signal from an AND logic operation of CLK and DCLK. The NOR'ed signal, ~(CLK+DCLK), is an output signal from a NOR logic operation of CLK and DCLK. The duty cycle of CLK for any practical data transfer system is stable. That is, CLK can be expected to stay very stable over time so that a DC averaging method can be used to generate a DC analog voltage to accurately determine the duty cycle of CLK. The ratio of duty cycles of CLK and CLK*DCLK or the ratio of duty cycles of inverse of CLK, ~CLK, and ~(CLK+DCLK) is a direct indicator of the percentage amount of delay between CLK and DCLK. As an example, with the duty cycle of CLK equals to 50%, DCLK is exactly 90 degrees shifted from CLK when the duty cycle of CLK*DCLK divided by the duty cycle of CLK equals 50%, as shown in FIG. 2. Thus, the ratio of duty cycles of CLK and CLK*DCLK or the ratio of duty cycles of inverse of ~CLK and ~(CLK+DCLK) can be used to produce DCLK with a desired delay with respect to CLK.

As illustrated in FIG. 3, when the duty cycle of CLK is less than or equal to 50%, the percentage amount of delay between CLK and DCLK to generate the optimal data clocking edges of DCLK for DDR scheme is achieved when the duty cycle of CLK*DCLK divided by the duty cycle of CLK equals 50%. When this ratio is achieved, the positive DCLK edge, which has a tighter timing, is positioned at the center of its smaller data valid window 202. The ratio percentage of duty cycles of CLK*DCLK and CLK may be changed to other percentages to support non-DDR scheme, such as Quad Data Rate (QDR) scheme.

As illustrated in FIG. 4, when the duty cycle of CLK is greater than or equal to 50%, the percentage amount of delay between CLK and DCLK to generate the optimal data clocking edges of DCLK for DDR scheme is achieved when the duty cycle of ~(CLK+DCLK) divided by the duty cycle of ~CLK equals 50%. When this ratio is achieved, the negative DCLK edge, which has a tighter timing, is positioned at the center of a smaller data valid window 204 between adjacent data valid windows 202. The ratio percentage of duty cycles of ~(CLK+DCLK) and ~CLK may be changed to other percentages to support non-DDR scheme, such as Quad Data Rate (QDR) scheme.

Turning back to FIG. 1, the system uses the observations illustrated in FIGS. 3 and 4 to generated the delayed clock signal, DCLK, with a desired delay to support, for example, DDR scheme. As shown in FIG. 1, the system includes a duty cycle measuring unit 102 and a delayed signal generating unit 104. The duty cycle measuring unit 102 operates to generate a duty cycle signal, LT50, which indicates whether the duty cycle of an input clock signal, CLK, is less than or greater than 50% (the reference duty cycle). In the illustrated implementation, when the duty cycle of CLK is less than 50%, the duty cycle measuring unit 102 produces "high" LT50. Conversely, when the duty cycle of CLK is greater than 50%, the duty cycle measuring unit 102 produces "low" LT50. The delayed signal generating unit 104 operates to delay CLK to produce DCLK using the observations related to FIG. 3 or FIG. 4 in response to LT50 produced by the duty cycle measuring unit 102. Thus, when LT50 is "high", i.e., the duty cycle of CLK is less than 50%, the delayed signal generating unit 104 selectively delays CLK so that the duty cycle of CLK*DCLK divided by the duty cycle of CLK substantially equals 50% to ensure DCLK has the desired delay. Similarly, when LT50 is low, i.e., the duty cycle of CLK is greater than 50%, the delayed signal generating unit 104 selectively delays CLK so that the duty cycle of ~(CLK+DCLK) divided by the duty cycle of ~CLK substantially equals 50% to ensure DCLK has the desired delay.

As shown in FIG. 1, the duty cycle measuring unit 102 includes an input terminal 106, a power supply rail 108, AND gates 110 and 112, Average Voltage generation Circuits (AVSs) 114 and 116, a voltage divider 118, and an analog voltage comparator 120 with hysteresis. The power supply rail 108 is connected to the two inputs of the AND gate 110. In this embodiment, the power supply rail 108 provides VCC supply voltage. The AND gate 110 performs an AND logic operation on the signals applied to its two inputs. Since the two inputs of the AND gate 110 are both connected to the power supply rail 108, the AND gate always outputs a steady "high" signal, which will be used as a reference signal representing a full swing 100% duty cycle signal. In other embodiments, the power supply rail 108 can be any signal source that provides a signal with 100% duty cycle. The output of the AND gate 110 is connected to the input of the AVC 114. The AVC 114 operates essentially as an analog low pass filter that generates a steady DC voltage from the input full swing signal to produce an output voltage signal, DC_100, which represents a DC voltage for a signal with 100% duty cycle. The output of the AVC 114 is connected to the voltage divider 118, which is connected to the positive input of the analog voltage comparator 120. The voltage divider 118 operates to divide DC_100 by 2 to produce an output voltage signal, DC_50, which represents a DC voltage for a signal with 50% duty cycle. In the illustrated embodiment, the voltage divider 118 includes two resistors 122 and 124, which have equal resistances. The resistors 122 and 124 are connected in series between the output of the AVC 114 and electrical ground. The positive input of the analog voltage comparator 120 is connected to the voltage divider 118 at a node between the resistors 122 and 124 to receive DC_50.

The input terminal 106 is connected to both inputs of the AND gate 112 to apply CLK to the inputs of the AND gate. In this embodiment, the AND gate 112 is identical to the AND gate 110. Since CLK fluctuates with respect to voltage, the AND gate 112 outputs a corresponding signal that fluctuates between zero and the same full swing level as the case for VCC. The output of the AND gate 112 is connected to the input of the AVC 116. The AVC 116 outputs a steady DC voltage signal, DC_CLK, which is proportional to the duty cycle of CLK. The output of the AVC 116 is connected to the negative input of the analog voltage comparator 120.

The analog voltage comparator 120 receives DC_CLK and DC_50 and produces a duty cycle signal, LT50, which indicates whether the duty cycle of CLK is less than or greater than 50%. When the duty cycle of CLK is less than 50%, the voltage of DC_CLK is lower than DC_50. Conversely, when the duty cycle of CLK is greater than 50%, the voltage of DC_CLK is higher than the voltage of DC_50. In this implementation, the analog voltage comparator 120 produces "high" LT50 when the voltage of DC_CLK is lower than the voltage of DC_50, indicating that the duty cycle of CLK is less than 50%. Conversely, the analog voltage comparator 120 produces "low" LT50 when the voltage of DC_CLK is higher than the voltage of DC_50, indicating that the duty cycle of CLK is greater than 50%. The output of the analog voltage comparator 120, i.e., LT50, is transmitted to the delayed signal generating unit 104.

As shown in FIG. 1, the delayed signal generating unit 104 includes AND gates 126 and 128, an inverter 130, a NOR gate 132, multiplexers 134 and 136, AVCs 138 and 140, a voltage divider 142, an analog voltage comparator 144, a delay adjust logic 146 and a tunable delay circuit 148. The AND gate 126, the inverter 130, the multiplexer 134, the AVC 138 and the voltage divider 142 will be described together as a group. The AND gate 128, the NOR gate 132, the multiplexer 136 and the AVC 140 will then be described as another group. The analog voltage comparator 144, the delay adjust logic 146 and the tunable delay circuit 148 will then be described.

The AND gate 126, the inverter 130, the multiplexer 134, the AVC 138 and the voltage divider 142 operate to generate a voltage signal, DC_iCLK_50. In this embodiment, DC_iCLK_50 represents 50% of the duty cycle of CLK or CLK, depending on whether the duty cycle of CLK is less than or greater than 50% as indicated by LT50 provided by the duty cycle measuring unit 102, to support the DDR scheme. However, in other embodiments, DC_iCLK_50 may represent other percentages of the duty cycle of CLK or CLK to support other data clocking schemes. Both of the inputs of the AND gate 126 is connected to the input terminal 106 to receive CLK. The AND gate 126 performs an AND logic operation on CLK applied to both of its inputs. The output of the AND gate 126 is connected to one of the two inputs of the multiplexer 134. The inverter 126 is also connected to the input terminal 106 to receive CLK. The inverter 126 inverts the received CLK to produce an inverse signal of CLK. The output of the inverter 130 is connected to the other input of the multiplexer 134. The multiplexer 134 is also connected to the output of the analog voltage comparator 120 of the duty cycle measuring unit 102 to receive LT50, which controls the multiplexer 134. If LT50 is "high", i.e., the duty cycle of CLK is less than 50%, then the output of the AND gate 126 is connected to the input of the AVC 138 through the multiplexer 134. If the LT50 is low, i.e., the duty cycle of CLK is greater than 50%, then the output of the inverter 130 is connected to the AVC 138 through the multiplexer 134. Thus, the output signal, iCLK, of the multiplexer 134 can represent either CLK or ~CLK, depending on whether LT50 is "high" or "low". In response to the received iCLK, the AVC 138 outputs a steady DC voltage signal, DC_iCLK, which is proportional to the duty cycle of CLK or ~CLK. The output of the AVC 138 is connected to the voltage divider 142, which is connected to the positive input of the analog voltage comparator 144. In this embodiment, the voltage divider 142 operates to divide DC_iCLK by 2 to produce an output voltage signal, DC_iCLK_50. However, in other embodiments, the voltage divider 142 may divide DC_iCLK by other divisors. In the illustrated embodiment, the voltage divider 142 includes resistors 150 and 152, which may have equal resistances to divide DC_iCLK by two or different resistances to divide DC_iCLK by other divisors. The resistors 150 and 152 are connected in series between the output of the AVC 138 and electrical ground. The positive input of the analog voltage comparator 144 is connected to the voltage divider 142 at a node between the resistors 150 and 152 to receive DC_iCLK_50.

The AND gate 128, the NOR gate 132, the multiplexer 136 and the AVC 140 operate to generate a voltage signal, DC_iADCLK, which represents the duty cycle of CLK*DCLK or ~(CLK+DCLK), depending on whether the duty cycle of CLK is less than or greater than 50% as indicated by LT50. One of the inputs of the AND gate 128 is connected to the input terminal 106 to receive CLK. The other input of the AND gate 128 is connected to the output of the tunable delay circuit 148, which produces DCLK by providing delay to CLK. Thus, the AND gate 128 receives CLK and DCLK and performs an AND logic operation on CLK and DCLK. The output of the AND gate 128 is connected to one of the two inputs of the multiplexer 136. Similar to the AND gate 128, one of the inputs of the NOR gate 132 is connected to the input terminal 106 to receive CLK, while the other input of the NOR gate is connected to the output of the tunable delay circuit 148 to receive DCLK. Thus, the NOR gate 132 performs a NOR logic operation on CLK and DCLK. The output of the NOR gate 132 is connected to the other input of the multiplexer 136. The multiplexer 136 is also connected to the output of the analog voltage comparator 120 of the duty cycle measuring unit 102 to receive LT50, which controls the multiplexer 136. If the LT50 is "high", i.e., the duty cycle of CLK is less than 50%, then the output of the AND gate 128 is connected to the input of the AVC 140 transmitted through the multiplexer 136. If the LT50 is "low", i.e., the duty cycle of CLK is greater than 50%, then the output of the NOR gate 132 is connected to the input of the AVC 140 through the multiplexer 136. Thus, the output signal of the multiplexer 136, iADCLK, can represent CLK*DCLK or ~(CLK+DCLK), depending on whether LT50 is "high" or "low". In response to the received iADCLK, the AVC 140 outputs a steady DC voltage signal, DC_iADCLK, which is proportional to the duty cycle of CLK*DCLK or ~(CLK+DCLK). The output of the AVC 140 is connected to the negative input of the analog voltage comparator 144.

The analog voltage comparator 144 receives and compares DC_iCLK_50 and DC_iADCLK to produce an output signal, which indicates the difference between the half the duty cycle of CLK and half the duty cycle of CLK*DCLK when LT50 is "high", or the difference between the half the duty cycle of ~CLK and half the duty cycle of ~(CLK+DCLK) when LT50 is "low". In this embodiment, the output signal represents "one" or "zero", where "one" indicates that more delay is desired and "zero" indicates that less delay is desired. The output signal from the analog voltage comparator 144 is used to adjust the delay of CLK to produce DCLK with the desired amount of delay. Thus, the output signal of the analog voltage comparator 144 is a delay polarity signal, which indicates whether DCLK has too much or too little delay.

The output of the analog voltage comparator 144 is connected to the delay adjust logic 146 to receive the output signal from analog voltage comparator 144. The delay adjust logic 146 operates to produce a control signal for the tunable delay circuit 148 in response to the output signal. The input of the tunable delay circuit 148 is connected to the input terminal 106 to receive CLK. The output of the tunable delay circuit is connected to an output terminal 154, as well as the respective inputs of the AND and NOR gates 128 and 132. The tunable delay circuit 148 is also connected to the output of the delay adjust logic 146 to receive the control signal from the delay adjust logic 146. The control signal from the delay adjust logic 146 is used to control the amount of delay provided by the tunable delay circuit 148 to produce DCLK from CLK. The delay adjust logic 146 and the tunable delay circuit 148 can be implemented in a number of ways. As an example, the tunable delay circuit 148 may be implemented as a series of multiplexer delay elements along a digitally tunable delay line with delay taps. In this example, the delay adjust logic 146 may be implemented as an up/down counter with up/down count controlled by the output of the analog voltage comparator 144. When output of the analog voltage comparator 144 is "high" indicating that the amount of delay is less than desired, the delay adjust logic 146 counts up by 1 to increment the delay by 1 step. When output of the analog voltage comparator 144 is "low" indicating that the amount of delay is more than desired, the delay adjust logic 146 counts down by 1 to decrement the delay by 1 step. This process is repeated at every evaluation cycle of the circuit until desired delay is attained.

Thus, when LT50 is "high", i.e., the duty cycle of CLK is less than 50%, the delayed signal generating unit 104 operates to delay CLK so that the duty cycle of CLK*DCLK equals half the duty cycle of CLK, i.e., the duty cycle of CLK*DCLK divided by the duty cycle of CLK equals 50%. In other words, the delayed signal generating unit 104 adjusts itself to satisfy the observations related to FIG. 3 to produce DCLK with desired delay. However, when LT50 is "low", i.e., the duty cycle of CLK is greater than 50%, the delayed signal generating unit 104 operates to delay CLK so that the duty cycle of ~(CLK+DCLK) equals half the duty cycle of ~CLK, i.e., the duty cycle of ~(CLK+DCLK) divided by the duty cycle of ~CLK equals 50%. In other words, the delayed signal generating unit 104 adjusts itself to satisfy the observations related to FIG. 4 to produce DCLK with desired delay.

Figure 5:
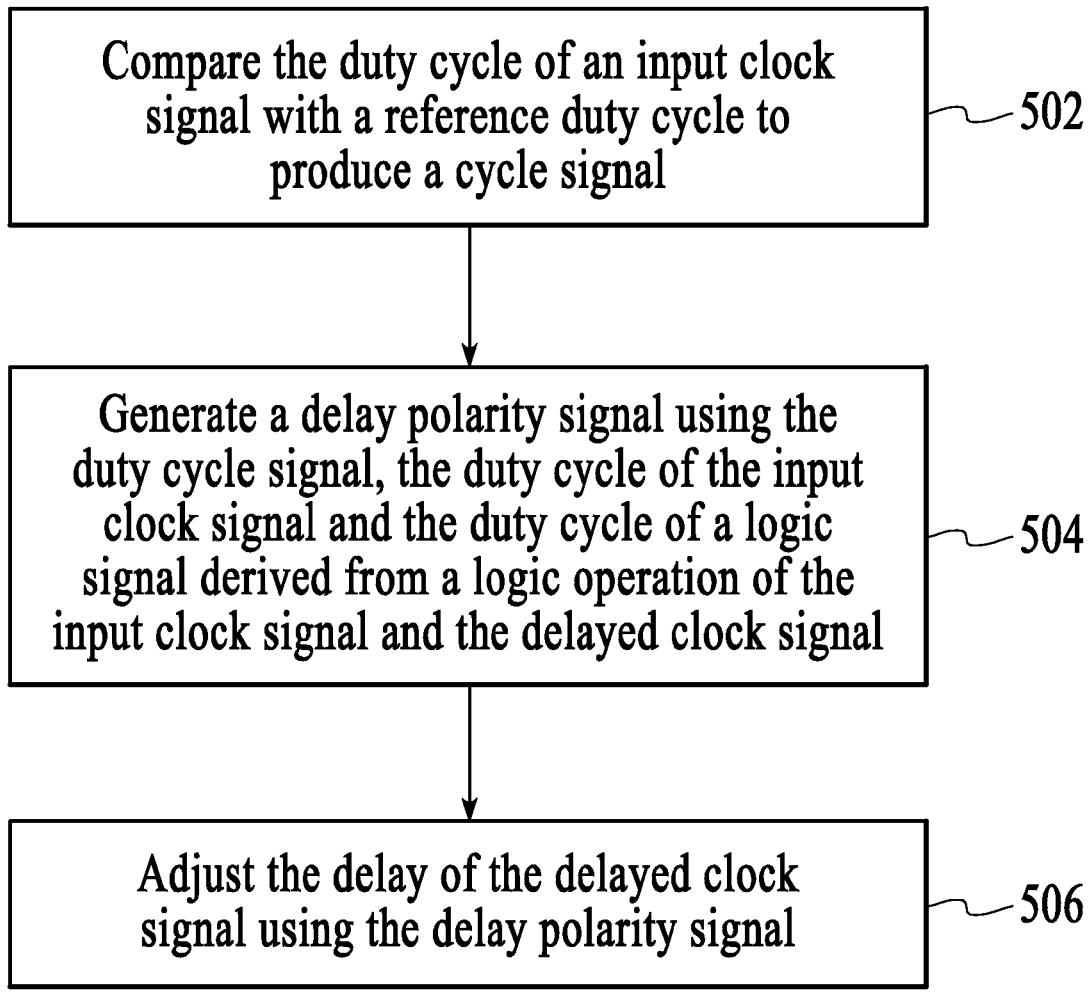
FIG. 5 is a flow diagram of a method for generating a delayed clock signal of an input clock signal in accordance an embodiment of the invention.

A method for generating a delayed clock signal of an input clock signal in accordance with an embodiment of the invention is described with reference to FIG. 5. At block 502, the duty cycle of the input clock signal is compared with a reference duty cycle to produce a duty cycle signal. Next, at block 504, a delay polarity signal is generated using the duty cycle signal, the duty cycle of the input clock signal and the duty cycle of a logic signal derived from a logic operation of the input clock signal and the delayed clock signal. Next, at block 506, the delay of the delayed clock signal is adjusted using the delay polarity signal.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A system for generating a delayed clock signal of an input clock signal, said system comprising:
   a duty cycle measuring unit connected to receive said input clock signal, said duty cycle measuring unit being configured to compare the duty cycle of said input clock signal with a reference duty cycle to produce a duty cycle signal; and
   a delayed signal generating unit connected to said duty cycle measuring unit to receive said duty cycle signal, said delayed signal generating unit being configured to generate a delay polarity signal using said duty cycle signal, said duty cycle of said input clock signal and the duty cycle of a logic signal derived from a logic operation of said input clock signal and said delayed clock signal, said delayed signal generating unit being further configured to adjust the delay of said delayed clock signal using said delay polarity signal, wherein said delayed signal generating unit is configured to generate said delay polarity signal based on one of a first comparison and a second comparison in response to said duty cycle signal.

2. The system of claim 1 wherein said first comparison being a comparison of said duty cycle of said input clock signal and the duty cycle of an AND'ed signal, said AND'ed signal being an output signal from an AND logic operation of said input clock signal and said delayed clock signal, and said second comparison being a comparison of the duty cycle of an inverse signal of said input clock signal and the duty cycle of a NOR'ed signal, said NOR'ed signal being an output signal from a NOR logic operation of said input clock signal and said delayed clock signal.

3. The system of claim 2 wherein said delayed signal generating unit is configured to generate a first voltage signal that is proportional to the duty cycle of one of said input clock signal and said inverse signal, said delayed signal generating unit being further configured to generate a second voltage signal that is proportional to the duty cycle of one of said AND'ed signal and said NOR'ed signal.

4. The system of claim 3 wherein said delayed signal generating unit comprises an inverter, a first average voltage generation circuit and a voltage divider that are connected to produce said first voltage signal, and wherein said delayed signal generating unit further comprises an AND gate, a NOR gate, and a second average voltage generation circuit that are connected to produce said second voltage signal.

5. The system of claim 4 wherein said delayed signal generating unit comprises a first multiplexer connected to receive said input clock signal and an output signal of said inverter to selectively transmit said input clock signal or said output signal of said inverter to an input of said first average voltage generation circuit in response to said duty cycle signal from said duty cycle measuring unit, and wherein said delayed signal generating unit further comprises a second multiplexer connected to receive output signals of said AND gate and said NOR gate to selectively transmit one of said output signals to an input of said second average voltage generation circuit in response to said duty cycle signal.

6. The system of claim 3 wherein said delayed signal generating unit comprises an analog voltage comparator connected to receive said first and second voltage signals, said analog voltage comparator being configured to compare said first voltage signal with said second voltage signal to produce said delay polarity signal.

7. The system of claim 6 wherein said delayed signal generating unit comprises a tunable delay circuit and a delay adjust logic, said tunable delay circuit being connected to receive said input clock signal to selectively delay said input clock signal to produce said delayed clock signal, said delay adjust logic being connected to said analog voltage comparator to receive said delay polarity signal, said delay adjust logic being configured to generate a control signal for said tunable delay circuit in response to said delay polarity signal to increase or decrease the amount of delay provided by said tunable delay circuit.

8. The system of claim 1 wherein said duty cycle measuring unit is configured to generate a voltage signal that is proportional to said duty cycle of said input clock signal and a reference voltage signal that represents said reference duty cycle, said duty cycle measuring unit being further configured to compare said voltage signal with said reference voltage signal to produce said duty cycle signal.

9. The system of claim 8 wherein said duty cycle measuring unit comprises a first average voltage generation circuit and a voltage divider that are connected to a signal source that provides a signal with 100% duty cycle to produce said reference voltage signal, and wherein said duty cycle measuring unit further comprises a second average voltage generation circuit that is connected to an input that provides said input clock signal to produce said voltage signal.

10. The system of claim 9 wherein said duty cycle measuring unit comprises an analog voltage comparator connected to said voltage divider and said second average voltage generation circuit to compare said voltage signal with said reference voltage signal to produce said duty cycle signal.

11. A system for generating a delayed clock signal of an input clock signal, said system comprising:
    a duty cycle measuring unit connected to receive said input clock signal, said duty cycle measuring unit being configured to compare the duty cycle of said input clock signal with a reference duty cycle to produce a duty cycle signal; and
    a delayed signal generating unit connected to said duty cycle measuring unit to receive said duty cycle signal, said delayed signal generating unit being configured to selectively delay said input clock signal to produce said delayed clock signal based on one of a first comparison and a second comparison in response to said duty cycle signal, said first comparison being a comparison of said duty cycle of said input clock signal and the duty cycle of an AND'ed signal, said AND'ed signal being an output signal from an AND logic operation of said input clock signal and said delayed clock signal, said second comparison being a comparison of the duty cycle of an inverse signal of said input clock signal and the duty cycle of a NOR'ed signal, said NOR'ed signal being an output signal from a NOR logic operation of said input clock signal and said delayed clock signal.

12. The system of claim 11 wherein said delayed signal generating unit is configured to generate a first voltage signal that is proportional to the duty cycle of one of said input clock signal and said inverse signal, said delayed signal generating unit being further configured to generate a second voltage signal that is proportional to the duty cycle of one of said AND'ed signal and said NOR'ed signal.

13. The system of claim 12 wherein said delayed signal generating unit comprises a first AND gate, an inverter, a first average voltage generation circuit and a voltage divider that are connected to produce said first voltage signal, and wherein said delayed signal generating unit further comprises a second AND gate, a NOR gate, and a second average voltage generation circuit that are connected to produce said second voltage signal.

14. The system of claim 11 wherein said duty cycle measuring unit is configured to generate a voltage signal that is proportional to said duty cycle of said input clock signal and a reference voltage signal that represents said reference duty cycle, said duty cycle measuring unit being further configured to compare said voltage signal with said reference voltage signal to produce said duty cycle signal.

15. The system of claim 14 wherein said duty cycle measuring unit comprises a first AND gate, a first average voltage generation circuit and a voltage divider that are connected to produce said reference voltage signal from a power supply, and wherein said duty cycle measuring unit further comprises a second AND gate and a second average voltage generation circuit that are connected to produce said voltage signal from said input clock signal.

16. A method for generating a delayed clock signal of an input clock signal, said method comprising:
    comparing the duty cycle of said input clock signal with a reference duty cycle to produce a duty cycle signal;
    generating a delay polarity signal using said duty cycle signal, said duty cycle of said input clock signal and the duty cycle of a logic signal derived from a logic operation of said input clock signal and said delayed clock signal; and
    adjusting the delay of said delayed clock signal using said delay polarity signal, wherein said generating said delay polarity signal includes performing one of a first comparison and a second comparison.

17. The method of claim 16 wherein said first comparison being a comparison of said duty cycle of said input clock signal and the duty cycle of an AND'ed signal, said AND'ed signal being an output signal from an AND logic operation of said input clock signal and said delayed clock signal, and said second comparison being a comparison of the duty cycle of an inverse signal of said input clock signal and the duty cycle of a NOR'ed signal, said NOR'ed signal being an output signal from a NOR logic operation of said input clock signal and said delayed clock signal.

18. The method of claim 17 wherein said generating said delay polarity signal further includes generating a first voltage signal that is proportional to the duty cycle of one of said input clock signal and said inverse signal, and generating a second voltage signal that is proportional to the duty cycle of one of said AND'ed signal and said NOR'ed signal.

19. The method of claim 18 wherein each of said generating said first voltage signal and said generating said second voltage signals comprises performing at least one of said AND logic operation and said NOR logic operation.

20. The method of claim 16 wherein said comparing includes generating a voltage signal that is proportional to said duty cycle of said input clock signal and a reference voltage signal that represents said reference duty cycle, said comparing further including comparing said voltage signal with said reference voltage signal to produce said duty cycle signal.

* * * * *